(12) United States Patent (10) Patent No.: US 9,129,711 B2
Kurosawa (45) Date of Patent: Sep. 8, 2015

(54) SEMICONDUCTOR MEMORY DEVICE

(71) Applicant: Kabushiki Kaisha Toshiba, Minato-ku (JP)

(72) Inventor: Yasuhiko Kurosawa, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 136 days.

(21) Appl. No.: 13/919,227

(22) Filed: Jun. 17, 2013

(65) Prior Publication Data

US 2014/0245089 A1 Aug. 28, 2014

Related U.S. Application Data

(60) Provisional application No. 61/770,760, filed on Feb. 28, 2013.

(51) Int. Cl.
*G11C 16/00* (2006.01)
*G11C 29/02* (2006.01)
*G11C 29/42* (2006.01)

(52) U.S. Cl.
CPC ............ *G11C 29/021* (2013.01); *G11C 29/028* (2013.01); *G11C 29/42* (2013.01); *G11C 16/00* (2013.01)

(58) Field of Classification Search
CPC .............. G11C 11/5642; G11C 16/26; G11C 16/3418; G11C 29/00; G11C 16/0483; G11C 16/34; G11C 16/3454
USPC ........................... 365/185.09, 185.03, 185.02
See application file for complete search history.

(56) References Cited

U.S. PATENT DOCUMENTS

| 7,372,731 | B2 * | 5/2008 | Ban ........................ 365/185.03 |
| 7,957,187 | B2 * | 6/2011 | Mokhlesi et al. ........ 365/185.03 |
| 8,406,053 | B1 * | 3/2013 | Dutta et al. ............. 365/185.03 |
| 2004/0170058 | A1 | 9/2004 | Gonzalez et al. |
| 2005/0013165 | A1 * | 1/2005 | Ban ........................ 365/185.2 |
| 2009/0080259 | A1 | 3/2009 | Alrod et al. |
| 2009/0282186 | A1 * | 11/2009 | Mokhlesi et al. ............ 711/103 |
| 2011/0145487 | A1 | 6/2011 | Haratsch et al. |
| 2013/0070524 | A1 * | 3/2013 | Dutta et al. ............. 365/185.03 |
| 2013/0148436 | A1 | 6/2013 | Kurosawa |

FOREIGN PATENT DOCUMENTS

| JP | 2004-5909 | 1/2004 |
| JP | 2010-541119 | 12/2010 |
| JP | 2011-527071 | 10/2011 |

* cited by examiner

*Primary Examiner* — Han Yang
*Assistant Examiner* — Xiaochun L Chen
(74) *Attorney, Agent, or Firm* — Oblon, McClelland, Maier & Neustadt, L.L.P.

(57) ABSTRACT

According to one embodiment, a semiconductor memory device includes memory cells each given one of threshold voltages to store data, and a controller configured to use read voltages to determine threshold voltages of the memory cells. The controller is configured to use voltages over a window to read data from the memory cells to determine distribution of the threshold voltages of the memory cells to estimate a read voltage. The controller is further configured to execute the estimation of a read voltage for each of the read voltages. The controller is further configured to use an estimated value of a first read voltage of the read voltages to determine a window for estimation of a second read voltage of the read voltages.

18 Claims, 13 Drawing Sheets

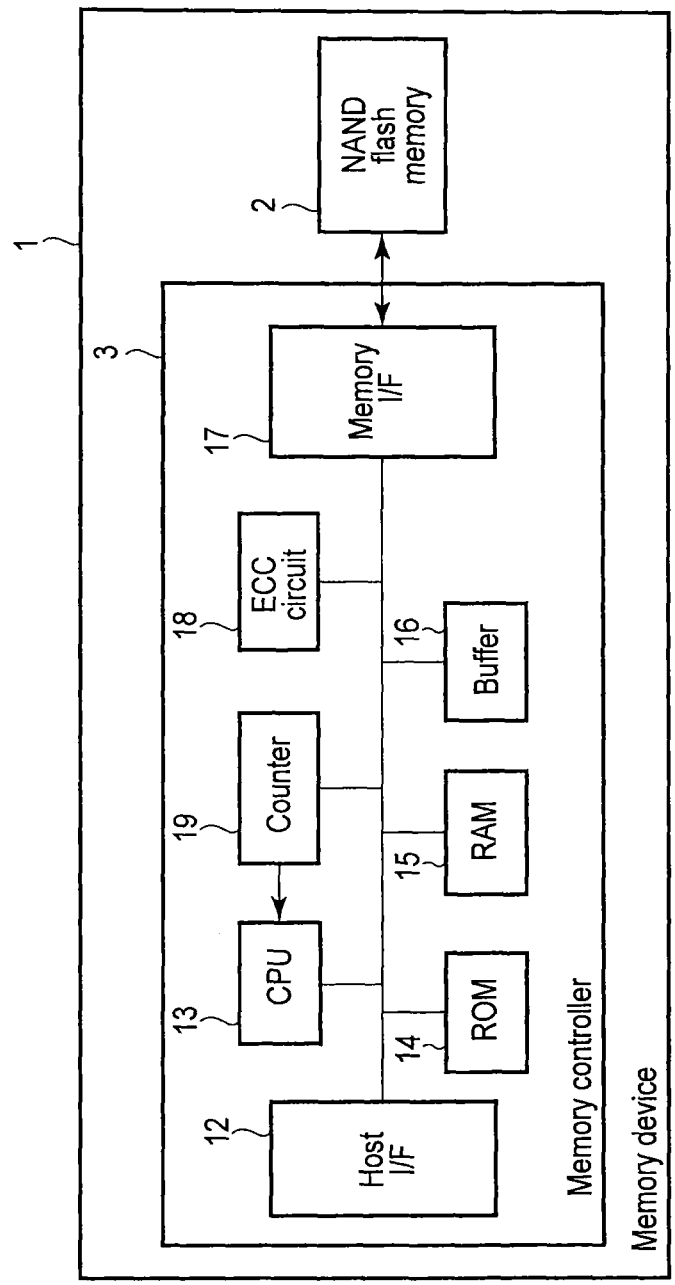
F I G. 1

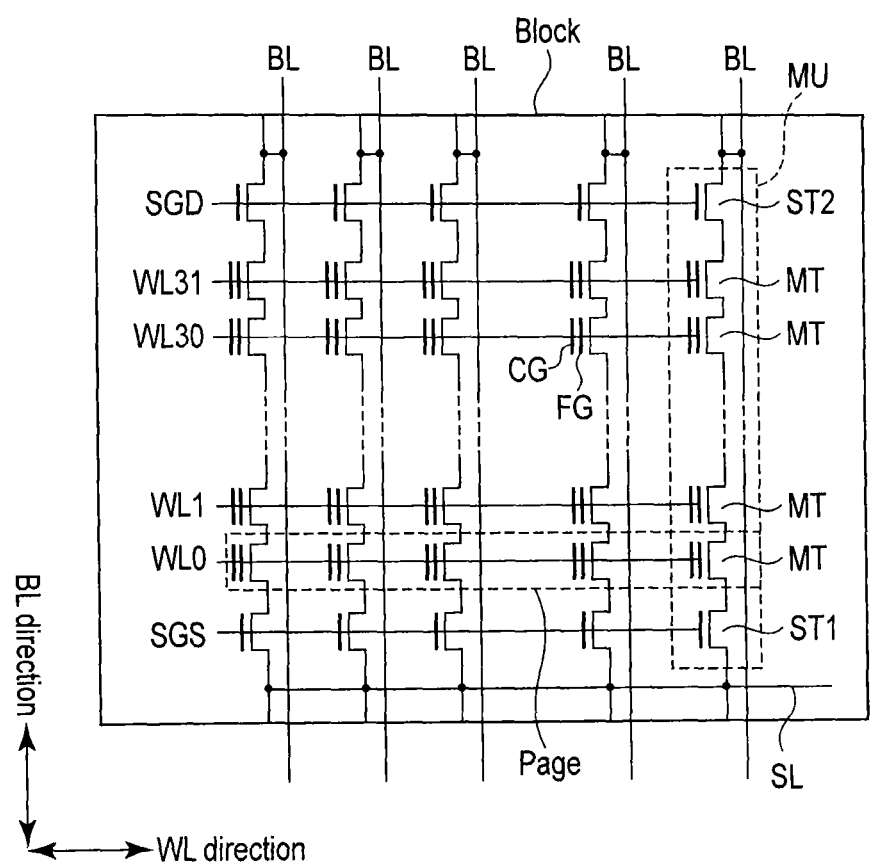
F I G. 3

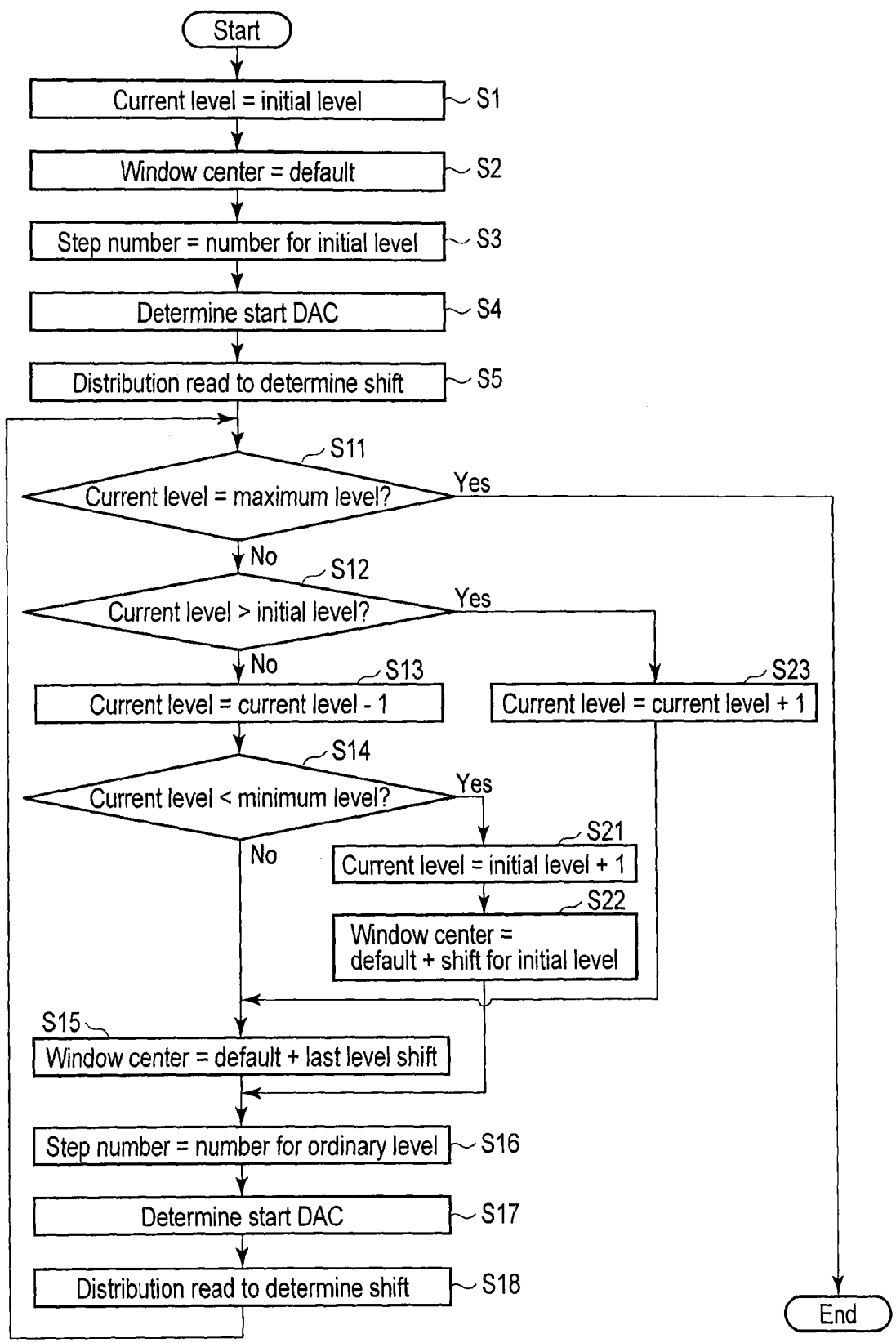
F I G. 4

SEMICONDUCTOR MEMORY DEVICE

CROSS-REFERENCE TO RELATED APPLICATIONS

This application claims the benefit of U.S. Provisional Application No. 61/770,760, filed Feb. 28, 2013, the entire contents of which are incorporated herein by reference.

FIELD

Embodiments described herein relate generally to a semiconductor memory device.

BACKGROUND

NAND flash memories may have threshold voltages of their cell transistors varied over time after a data write.

BRIEF DESCRIPTION OF THE DRAWINGS

FIG. 1 illustrates a block diagram of a memory device of a first embodiment.

FIG. 3 is a circuit diagram of an example block.

FIG. 4 is a flowchart of read level estimation of the first embodiment.

DETAILED DESCRIPTION

Figure 2:
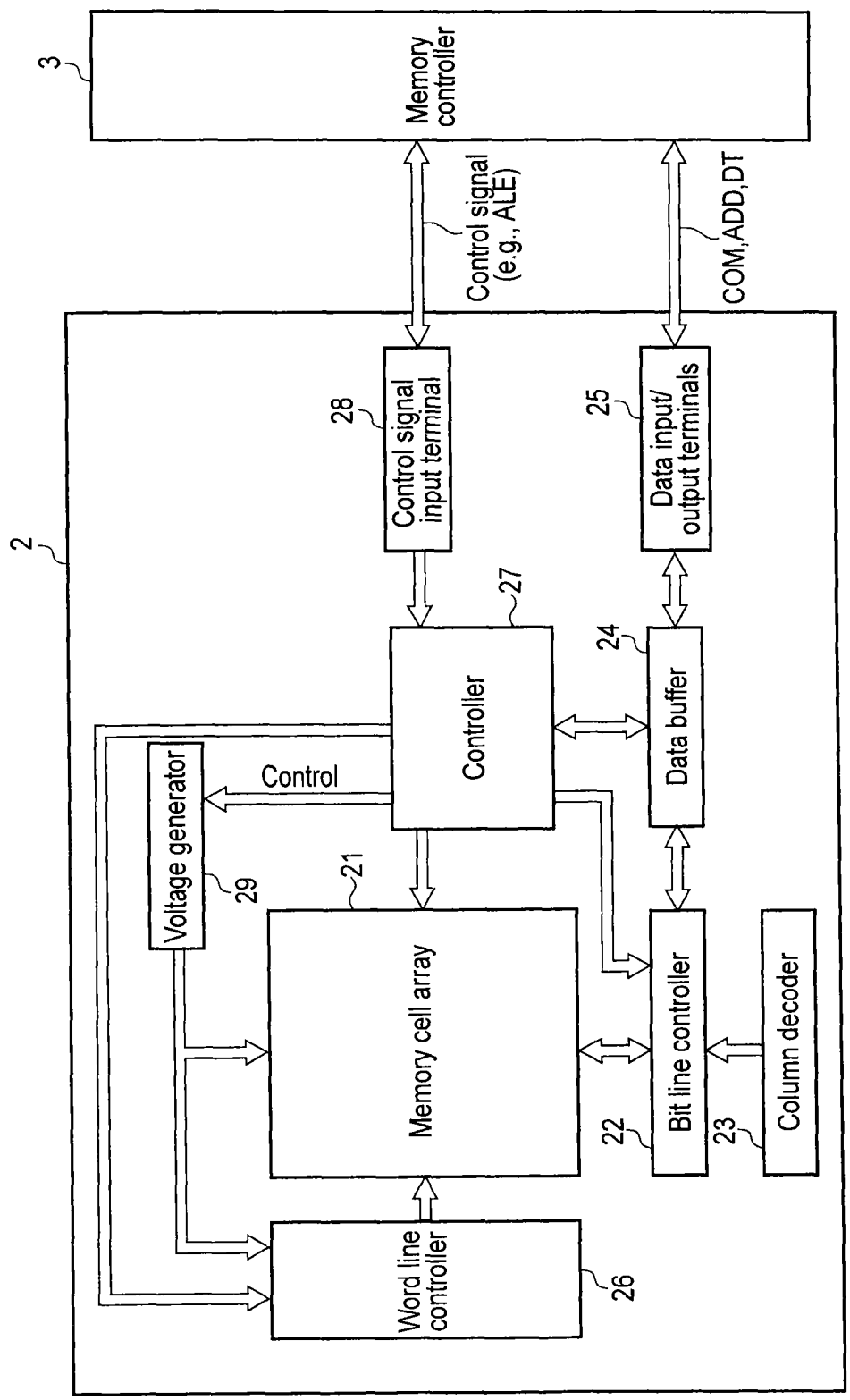
FIG. 2 schematically illustrates a memory of the first embodiment.

In general, according to one embodiment, a semiconductor memory device includes memory cells each given one of threshold voltages to store data, and a controller configured to use read voltages to determine threshold voltages of the memory cells. The controller is configured to use voltages over a window to read data from the memory cells to determine distribution of the threshold voltages of the memory cells to estimate a read voltage. The controller is further configured to execute the estimation of a read voltage for each of the read voltages. The controller is further configured to use an estimated value of a first read voltage of the read voltages to determine a window for estimation of a second read voltage of the read voltages.

Techniques are known to store data of two or more bits in a memory cell. Such a multi-level data holding technique may also be applied to the NAND flash memories. In a multi-level NAND flash memory, a memory cell transistor can have one of multiple threshold voltages. A threshold voltage according to data to be stored is given to a cell transistor. For example, in order to store three-bit data in per memory cell, one of eight threshold voltages is given to each cell transistor. For a data read, determination of whether the threshold voltage of a cell transistor exceeds a particular read voltage is used. However, threshold voltages of cell transistors, however, vary as used and the form of their distribution also varies. Change of the threshold voltages of the cell transistors changes original relation between the threshold voltages of the cell transistor and read voltages. This results in erroneous reads.

In order to address the read error, optimum read voltages to minimize read errors are estimated. Thus estimated read voltages are used instead of the original read voltages. The estimated read voltages are shifted from the respective original read voltages. A series of operations to estimate an optimum read voltage may be referred to as a Vth tracking. The Vth tracking involves a distribution read to estimate an optimum read voltage. In general, the distribution read is implemented in the NAND flash memories.

The distribution read involve repeated reads with read voltages varied by a fixed quantity. A controller in the memory, for example, determines a search window with a particular read voltage as its center, and executes the distribution read over the search window. While the distribution read is being executed, some technique and criteria are used to estimate the optimum read voltage. In accordance with the number of threshold voltages which a cell transistor can take, some read voltages are necessary. For this reason, a distribution read and optimum read voltage estimation are executed for each read voltage.

A search window needs to be large in order to accommodate a case with the optimum read voltage shifted from the original value significantly. A large search window, however, increases the time taken for the distribution read, and further may result in an erroneously estimated optimum read voltage. Specifically, the optimum value is estimated through, for example, searching a threshold voltage distribution curve obtained by the distribution read for a relative minimum. Then, in a process of search of the relative minimum, the relative minimum of the threshold distribution for a read voltage adjacent the to-be-estimated read voltage may be determined as the relative minimum to be found, for example. Erroneous detection of relative minimums can be prevented with various algorithm. Such algorithm to prevent erroneous detection, however, may be in turn complicated, and therefore increase the time to execute the algorithm.

Embodiments will now be described with reference to figures. Components with substantially the same functionalities and configurations will be referred to with the same reference number and duplicate descriptions will be made only when necessary. Description for a particular embodiment is applicable to other embodiments. Note that the figures are schematic. Each embodiment described below is used to only illustrate a device and/or method to implement a technical idea of this embodiment, which is not limited as the following examples. Moreover, each functional block may be implemented as a hardware, computer software, or combination of both. For this reason, in order to clearly illustrate this interchangeability of hardware and software, descriptions will be made in terms of their functionality in general. Those skilled in the art may implement the functional blocks in varying ways for each particular application, but any implementation approach is included in the scope of the embodiments. It is not essential that the functional blocks are distinguished from one another as described blow in specific examples. For example, some of functions may be implemented by functional blocks different from those illustrated below. Furthermore, an illustrated functional block may be divided into functional sub-blocks.

First Embodiment

FIG. 1 is a block diagram of a memory device according to the first embodiment. A semiconductor memory device 1 includes a semiconductor memory 2 and a memory controller 3. The semiconductor memory device 1 may be an SD card. The semiconductor memory device 1 communicates with a host device (not shown). The memory controller 3 receives a write command, a read command, and a erase command from, for example, a host device, and accesses the memory 2 in accordance with a received command. The memory controller 3 includes a host interface (I/F) 12, a central processing unit (CPU) 13, a read only memory (ROM) 14, a random access memory (RAM) 15, a buffer 16, a memory interface 17, an error correction circuit (ECC circuit) 18, and a counter 19. They are coupled by a bus.

The host interface 12 allows the semiconductor memory device 1 to be interfaced with a host device. The CPU 13 manages the entire operation of the semiconductor memory device 1 in accordance with control programs. The ROM 14 stores firmware, such as control programs used by the CPU 13. The RAM 15 is used as a work area for the CPU 13, and stores control programs and various kinds of tables, etc. The buffer 16 temporarily stores data transmitted from the host device, data read from the memory 2, or intermediate data as a result of a randomize process, ECC-coding, or ECC correction. Only one buffer 16 is illustrated in the figure; however it may be implemented as multiple buffers in accordance with its use or a design restriction. The memory interface 17 allows the memory controller 3 to be interfaced with the memory 2. The ECC circuit 18 corrects errors in data read from the memory 2, and adds codes for error correction to data to be written in the memory 2. The counter 19 is used to count 1-data or 0-data included in data read from the memory 2 to determine a histogram of threshold voltage distribution during execution of the distribution read, which will be described later.

FIG. 2 schematically illustrates the memory of the first embodiment. The memory 2 may be a NAND flash memory. As shown in FIG. 2, the memory 2 includes a memory cell array 21, a bit line controller 22, a column decoder 23, a data buffer 24, data input/output terminals 25, a word line controller 26, a controller 27, a control signal input terminal 28, and the voltage generator 29. The memory 2 can store data which consists of two or more bits per memory cell. The description will be given of an example of storing data indicative of one of eight levels with three bits by each memory cell. The first embodiment is, however, also applicable to levels of more or less than eight levels.

The memory cell array 21 includes blocks, word lines, bit lines, a source line, etc. As shown in FIG. 3, a block includes memory cell columns MU. A memory cell column MU includes cell transistors MT coupled in series, and select transistors ST1 and ST2 coupled to this serial structure. The transistor ST1 is coupled to the source line and the transistor ST2 to a corresponding bit line BL. The memory cell array 21 erases data per block.

Each cell transistor MT has a tunnel insulator, a charge storage layer, an intermediate insulator, and a control electrode (word line) stacked on a well in a semiconductor substrate, and source/drain areas. Each cell transistor MT has a threshold voltage variable in accordance with the number of the electrons in the charge storage layer to store data corresponding to one of the eight levels in accordance with the threshold voltage. Control electrodes of cell transistors MT belonging to the same row is coupled to the same word line WL. The memory space of cell transistors MT coupled to the same word line WL form pages. The memory cell array 21 reads and writes data per page.

The transistors ST1 and ST2 each includes a gate insulator and a gate electrode stacked on the semiconductor substrate, and source/drain areas. Gates of transistors ST1 belonging to the same row are coupled to a select gate line SGS. Gates of transistors ST2 belonging to the same row are coupled to a select gate line SGD.

Referring back to FIG. 2, the bit line controller 22 reads data of the memory cells through the bit lines BL and detects the state of the memory cells through the bit lines BL. The bit line controller 22 applies write (program) voltages to the memory cells through the bit lines BL to write (program) data in the memory cells. The bit line controller 22 includes components, such as sense amplifiers and data storage circuits (not shown). The sense amplifier amplifies potentials on the bit lines BL. A particular data storage circuit is selected by the column decoder 23. Data read to the selected data storage circuit from the memory cells is output to outside the memory 2 from the data input/output terminals 25 through the data buffer 24.

The data input/output terminals 25 are coupled to the memory controller 3. The data input/output terminals 25 receive a command COM of various types which controls operation of the memory 2, an address ADD, and data DT from the external memory controller 3, and receives data DT or outputs data DT to the external memory controller 3.

Write data DT input to the data input/output terminals 25 is supplied to a particular selected data storage circuit via the data buffer 24. The command COM and address ADD are supplied to the controller 27.

The word line controller 26 receives from the voltage generator 29 voltages required for reads, writes, or erases. The word line controller 26 applies received voltages to selected word lines WL in accordance with control of the controller 27.

The controller 27 controls the memory cell array 21, bit line controller 22, column decoder 23, data buffer 24, word line controller 26, and voltage generator 29. The controller 27 is coupled to the control signal input terminal 28, and is controlled by control signals input from outside through the control signal input terminal 28, such as an address latch enable (ALE), a command latch enable (CLE), a write enable (WE), and a read enable (RE).

The voltage generator 29 provides voltages to the memory cell array 21 and word line controller 26 in accordance with control of the controller 27 during operation such as a write, read, and erase. Specifically, the voltage generator 29 generates voltages VPGM, VPASS, and VISO during data writes, and a voltage VERA during data erases. The voltage generator 29 also generates a voltage VREAD and various read voltages during a data read.

The eight levels of data are referred to as an erase (Er) level, A level, B level, C level, D level, E level, F level, and G level in the ascending order of their threshold voltages. Hereinafter, the erase level, A level, B level, C level, D level, E level, F level, or G level may be referred to as a data level. Though memory cells are written in an attempt to have the same threshold voltages, the threshold voltages in fact vary because of variation in properties of the memory cells. As a result, the threshold voltages for each data level have distribution. In order to determine A level to G level of data, respective read levels (voltages) are necessary. Each read level (each of $Vth\_A$ to $Vth\_G$) is ideally smaller than the minimum threshold voltage of the corresponding data level and larger than the maximum threshold voltage of the data level smaller by one level. Then, each read level is used to distinguish the two data levels at its both sides. The voltage VREAD turns on the cell transistors regardless of their threshold voltages.

The controller 27 also uses digital data to control voltage generation by the voltage generator 29. The voltage generator 29 has a digital-to-analog converter, which receives digital data from the controller 27. The voltage generator 29 generates various voltages in accordance with the digital data. The digital data includes one for various uses such as for read voltages. The digital data is stored, for example, in a control-data-storage area in the memory cell array 21. The digital data is preset, and transferred to a register (not shown) from the memory cell array 21 upon power-on. The digital data is described with a unit of DAC in the following. The digital data includes various values such as initial values for distribution reads, which will be described later.

The controller 27 can also add a positive or negative adjustment to digital data to generate adjusted digital data. For example, the controller 27 adds an adjustment to digital data for generating a particular read voltage to generate an adjusted read voltage. The controller 27 also applies an adjustment to particular digital data for a distribution read to generate adjusted digital data. The digital data for the distribution read can take a value (DAC value) from 0 to 767, for example.

As one of techniques to improve reliability of storage of data in the memory 2, there is data randomize operation. The data randomize operation is executed in the ECC circuit 18 or a dedicated circuit (not illustrated in FIG. 1), or through a process by the CPU 13. The memory 2 may be a so-called three-dimensional memory with BiCS techniques, or a BiCS memory.

Referring now to FIGS. 4 to 8, a distribution reads by the memory device according to the first embodiment will be described. FIG. 4 illustrates the flow of read level estimation according to the first embodiment. The read level estimation through the distribution read may be started with an instruction by the external memory controller 3 when, for example, the memory controller 3 determines that errors of data read from the memory 2 exceed the error correction capacity of the ECC circuit 18 in the memory controller 3. The memory controller 3 is configured to execute the FIG. 4 flow.

In step S1, the memory controller 3 sets a read level for which an optimum is estimated as an initial read level (parameter Current level=initial). The initial read level is typically a read level which varies least among all read levels except for the maximum level (the read level for G level in the current example). Specifically, it is as follows. Threshold voltages of memory cells change over time after the write, repeated erases and writes, and repeated reads. In general, among read levels except for the maximum one, the second maximum read level experiences a threshold voltage shift least. Then, this second maximum read level is selected as the initial read level. Typically, the initial read level is for F level. The read level for E level is, however, used as the initial read level in the following for the convenience of describing the embodiment and easier understanding by the readers. The reasons will be described later. Note that generally read levels for E level as well as F level experience a threshold voltage shift least. The reason why the maximum read level is excluded is its difficulty to be used because of looser requirements on threshold voltage control posed on it than those on other read levels.

With the following steps S2 to S5, the memory controller 3 executes the distribution read to estimate an optimum current read level (initial read level). The defaults are preset for respective read levels. The default read levels are, however, predetermined based on a state prior to change of threshold voltages of cell transistors due to repeated use and time lapse, etc. For this reason, the optimum read levels shift from the defaults with use of the cell transistors. The estimation in steps S2 to S5 estimates the optimum read level with the present condition reflected.

In step S2, the memory controller 3 determines the center of a search window for the distribution read for the present read level. The memory controller 3 uses the default (read voltage $Vth\_e$ for E level in the ongoing context) as the center for the initial read level (parameter window center=default $Vth\_e$). Default $Vth\_e$ is, for example, 500 DAC. In general, a distribution read is executed over a search window which consists of positive and negative offsets from a center voltage. Over the search window, discrete voltages with a predetermined step width are used to read data with a binary mode. Specifically, the controller 27 determines whether a particular cell transistor has a threshold voltage exceeding each read voltage. The width of the step and the total number of the steps in a distribution read are, for example, registered in the memory cell array 21 as the above-described digital data.

In step S3, the memory controller 3 sets the number of steps for the distribution read for the current read level to that for the initial read level. The number of steps for the initial read level can be predetermined to allow a range over which the distribution read is executed to include the optimum read level with an expected shift for the initial read level taken into consideration. For example, with an example of a 4 DAC step width, the number of steps is ten in each of both positive and negative directions from the center. With a step width other than 4 DAC, the number of steps has a corresponding value.

In step S4, the memory controller 3 calculates a start level (voltage) for the distribution read. The start voltage is (center)−(number of steps)×(step width). The start voltage is 460 DAC according to the ongoing context.

In step S5, the memory controller 3 executes the distribution read in accordance with the set parameters, and estimates the optimum value for the current read level. The estimation can be executed by any methods. For example, the optimum read level through the distribution read can be estimated with methods described in the specification of the U.S. patent application Ser. No. 13/544,147, the entire contents of which are incorporated herein by reference. Note that the "optimum" read level as used herein depends on a method of estimation of a shifted read level. Therefore, the "optimum" read level does not mean the only read level optimum under all conditions. Rather, it means the read level determined to be optimum with the used method. The "optimum" read level, however, may be defined as, for example, minimizing errors of data read from memory cells for which the "optimum" read level is estimated with the used method.

Figure 5:
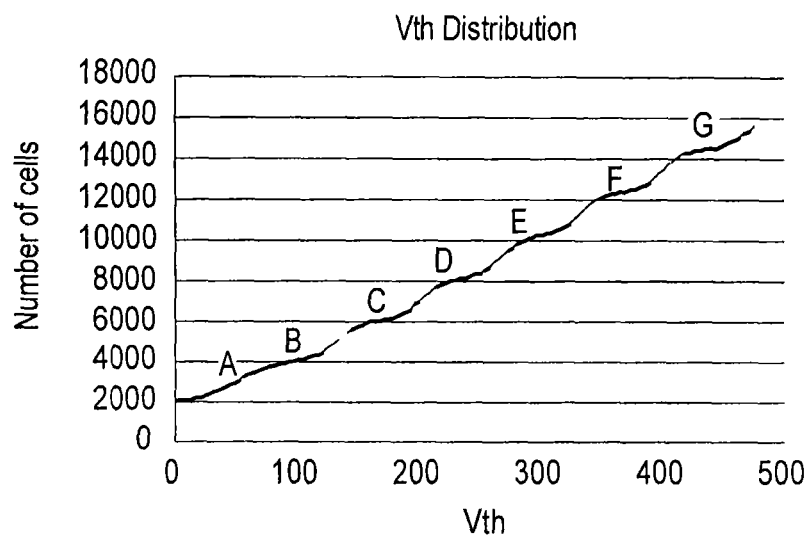
FIG. 5 illustrates an example relationship between threshold voltages and counts of 1-data-holding memory cells in the first embodiment.

An example of the distribution read for a particular read level and optimum read level estimation will be briefly described. First, for the distribution read and optimum read level estimation, the memory controller 3 instructs the memory 2 to execute the distribution read. The instructions of the distribution read include its target and a read level. Upon receipt of the instructions, the controller 27 uses the initial level as the read level to read data from memory cells for which the distribution read is executed in the binary mode. The memory controller 3 counts and stores memory cells which hold read 1-data through the counter 19. The memory controller 3 then executes this counting of 1-data-holding memory cells with a read level larger than the start level by the step width. Similarly, while the read level is repeatedly increased by the step width, the memory controller 3 counts 1-data-holding memory cells over the search window. FIG. 5 illustrates thus obtained counts of 1-data-holding memory cells for read levels on the vertical axis, and threshold voltages on the horizontal axis with the corresponding DAC values. FIG. 5, however, includes results for all the read levels (read levels for A level to G level). When step S5 finishes, only a section for the current read level (read level for) is obtained.

Figure 6:
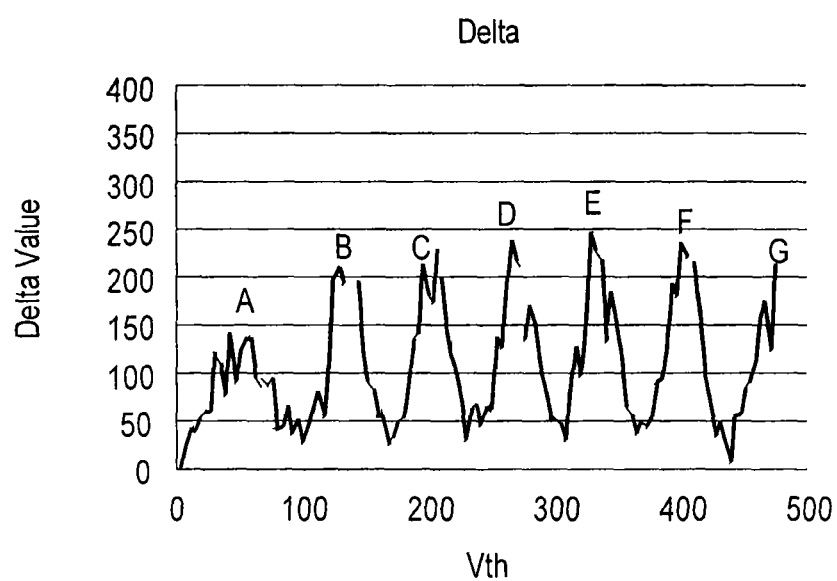
FIG. 6 illustrates example differences of counts of 1-data-holding memory cells in the first embodiment.

The memory controller 3 then creates a histogram based on the count of 1-data-holding memory cells for each read level of FIG. 5. Specifically, it calculates the difference of the count for a read level and that for the adjacent read level, and executes this calculation for each read level. Then, threshold voltages (levels) are plotted along the horizontal axis and the count differences are plotted along the vertical axis, to obtain the histogram as shown in FIG. 6. The histogram also illustrates the count differences of 1-data-holding memory cells of FIG. 5 on the horizontal axis in 4 DAC unit. This histogram also includes the results for all read levels (read levels for A level to G level). When step S5 is completed, only a section for the current read level (read level for E level) is obtained. Thus obtained histogram is used to estimate each optimum read level.

Figure 7:
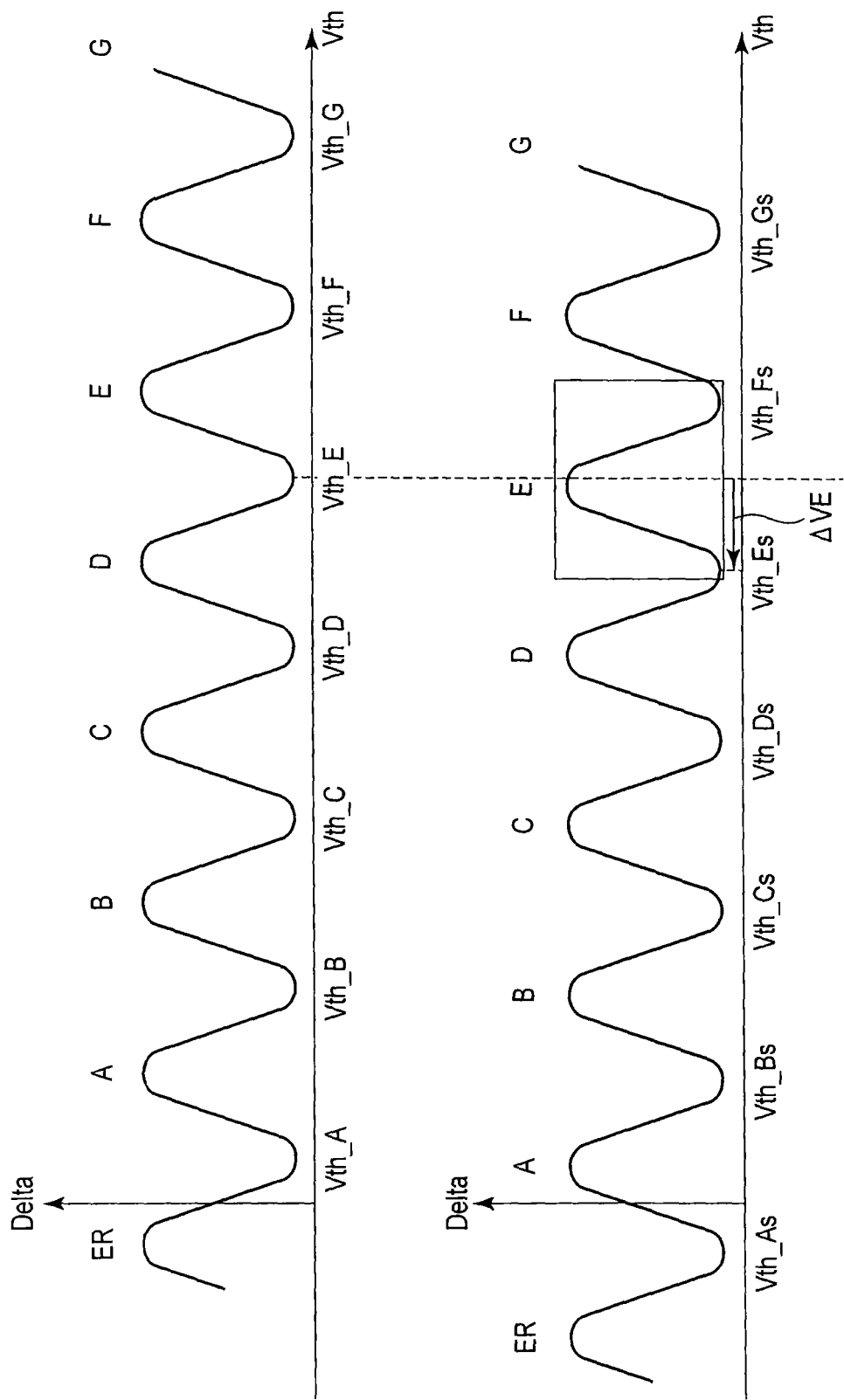
FIG. 7 conceptually illustrates read level estimation of the first embodiment.

FIG. 7 conceptually illustrates read level estimation of the first embodiment. FIG. 7 illustrates an original histogram in the upper part and a shifted histogram in the lower part. An original histogram refers to, typically, one for cell transistors which have not yet experienced deterioration though use right after they have data written. The lower part of FIG. 7 also illustrates the histogram for all the read levels. When the distribution read for E level finishes, only a part of the histogram for the search window for the distribution read is known. The known section of the histogram is illustrated as enclosed by a square with Vth_E as its center in the lower part of FIG. 7. The optimum read level Vth_E for E level has shifted from the original level Vth_E in the negative direction by ΔVE as can be seen from FIG. 7. This difference ΔVE is the shift value for E level. A shift value may be positive or negative.

Referring back to FIG. 4, following step S5, the memory controller 3 determines whether the current read level is the maximum one (for example, one for G level) (step S11). The determination in step S11 corresponds to determination whether distribution reads for all read levels have finished. FIG. 4 and the associated description are related to an example where, among distribution reads for all read levels, one for the maximum read level is executed last as will be described. For this reason, it is determined whether the last distribution read was one for G level. With determination in step S11 Yes, the flow finishes.

In contrast, if the determination in step S11 is No, the flow shifts to step S12. The steps after step S12 are for distribution reads for the remaining read levels other than the initial read level. The order of distribution reads for these remaining read levels does not limit the first embodiment. The read level estimated last is also not limited to the above G-level example. In contrast, each optimum read level is generally correlated to an optimum adjacent read level more highly than other optimum read levels. This phenomenon is used to estimate a particular optimum read level with an optimum adjacent read level as an example.

In step S12, the memory controller 3 determines whether the current read level is larger than the initial read level (one for E level in the current context). With determination in step S12 Yes, the flow shifts to step S13. In step S13, the memory controller 3 subtracts one from the current read level (Current level=Current level−1). The memory controller 3 then determines whether the current read level is smaller than the minimum read level (for example, one for A level) (step S14). With determination in step S14 No, the flow shifts to step S15.

Figure 8:
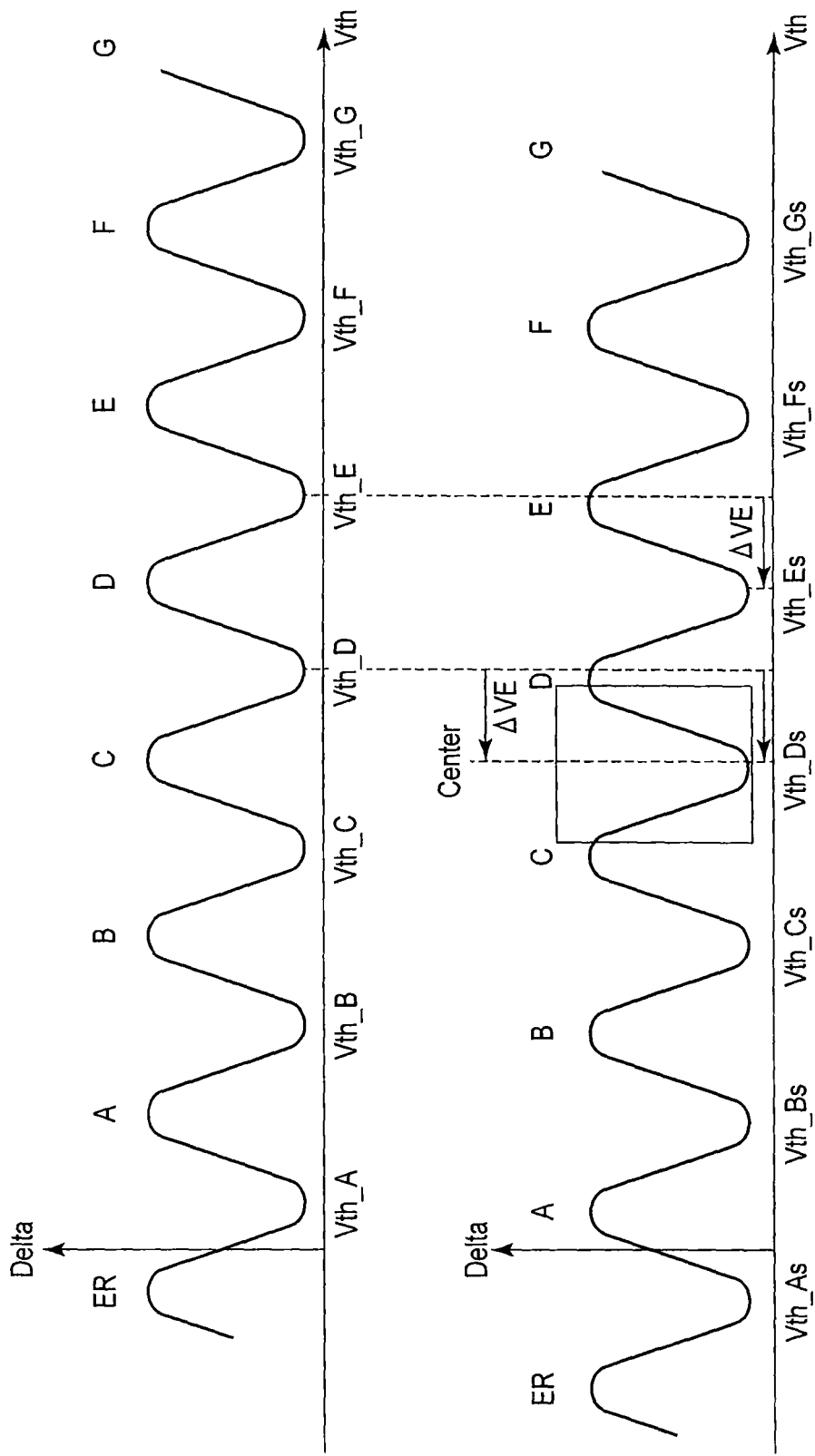
FIG. 8 conceptually illustrates read level estimation of the first embodiment.

In step S15, the memory controller 3 sets the center of a search window for the distribution read for the current read level to the sum of the default for the current read level and the shift value for the read level from the last distribution read. Specifically, with current D level, the center for D level is (default center for D level)−ΔVE as shown in FIG. 8.

In step S16, the memory controller 3 sets the number of steps of the distribution read for the current read level to that for general level. The number for general level is smaller than that for initial read level because the center of the search window has been adjusted, and the optimum read level is expected to be found even in such a narrower search window. For example, with an example where the number of steps for initial read level is ±10 steps from the center, the number of steps for general level is ±7 steps. The value of ±7 is selected to make the search window have 80 to 120% of the difference between adjacent read levels.

Step S16 continues to step S17. Step S17 is the same as step S4. Specifically, in step S17, the memory controller 3 calculates a start level for the distribution read. Thus, with steps S15 to S17, a window for a read level other than the initial read level is determined in accordance with the optimum (or shift value) for the initial read level.

In step S18, the memory controller 3 executes the distribution read in accordance with the set parameters, and estimates an optimum for the current read level. The flow returns to step S11 after step S18.

The memory controller 3 repeats steps S11 to S19, and estimates optimum read levels sequentially toward the minimum read level from the initial read level. As described above, the memory controller 3 uses the shift value for the adjacent (previous) read level to calculate the center during the distribution read for estimation. After the optimum for the minimum read level (for A level in the current context) is estimated, the determination in step S14 is Yes. As a result, the flow shifts to step S21.

In step S21, the memory controller 3 sets the current read level as a read level higher than the initial read level (for E level, for example) by one level. Step S21 continues to step S22. In step S22, the memory controller 3 sets the center of a search window for the distribution read for the current read level to the sum of the default for the current read level and the shift value for the initial read level.

Step S22 continues to step S16. In steps S16 to S18, the memory controller 3 estimates an optimum for the current read level (for example, a level higher than the initial read level by one level). In the following step S12, the determination is Yes and the flow shifts to step S23.

In step S23, the memory controller 3 increases the current read level (Current level=Current level+1) by one. Step S23 continues to step S15. In steps S15 to S18, the memory controller 3 estimates the optimum for the current read level.

The memory controller 3 repeats steps S11, S12, S23 and S16 to S19 to estimate optimum read levels sequentially toward the maximum read level from the level one level higher than initial read level. Also in this estimation, the memory controller 3 uses the shift value for the adjacent (previous) read level to calculate the center in each distribution read. After the optimum of the maximum read level (for G level, for example) is estimated, determination in step S11 is Yes. As a result, the flow finishes.

The description so far has been made to an example where the initial read level is a read level smaller than the maximum level (for E level) by two levels instead of one level smaller (for F level). The reason is that this results in transition from the initial read level in both the positive and negative directions, which helps the readers understand the flow. The first embodiment, however, is no limited by selection of the initial read level and the order of read levels other than the initial read level as described above. The center of a search window for a particular distribution read only needs to be adjusted with the shift value for an adjacent read level. After the initial read level, a read level larger than it by one or more read levels may be estimated and that smaller than it by one or more read levels may be estimated unlike the FIG. 4 flow.

As described above, according to the first embodiment, the center of the search window for each optimum read level estimation is set to the sum of the default and the shift value estimated for an adjacent read level. This adjusted center agrees with a state after threshold voltage shifts better than the default center. For this reason, even a reduced search window for the distribution read is highly expected to include the optimum read level within it. Reduced search windows contribute to improvement in processing speed.

Moreover, an optimum read level is generally positioned near the adjusted center. This allows for easy estimation of the optimum read level without complicated estimation algorithm to cope with a case of multiple local minimums of the distribution curve included in a search window. This also contributes to reducing time taken to estimate the optimum read level, and reduces the possibility of incorrect estimation.

Second Embodiment

In a second embodiment, the center of a search window for the initial read level is also adjusted.

Figure 9:
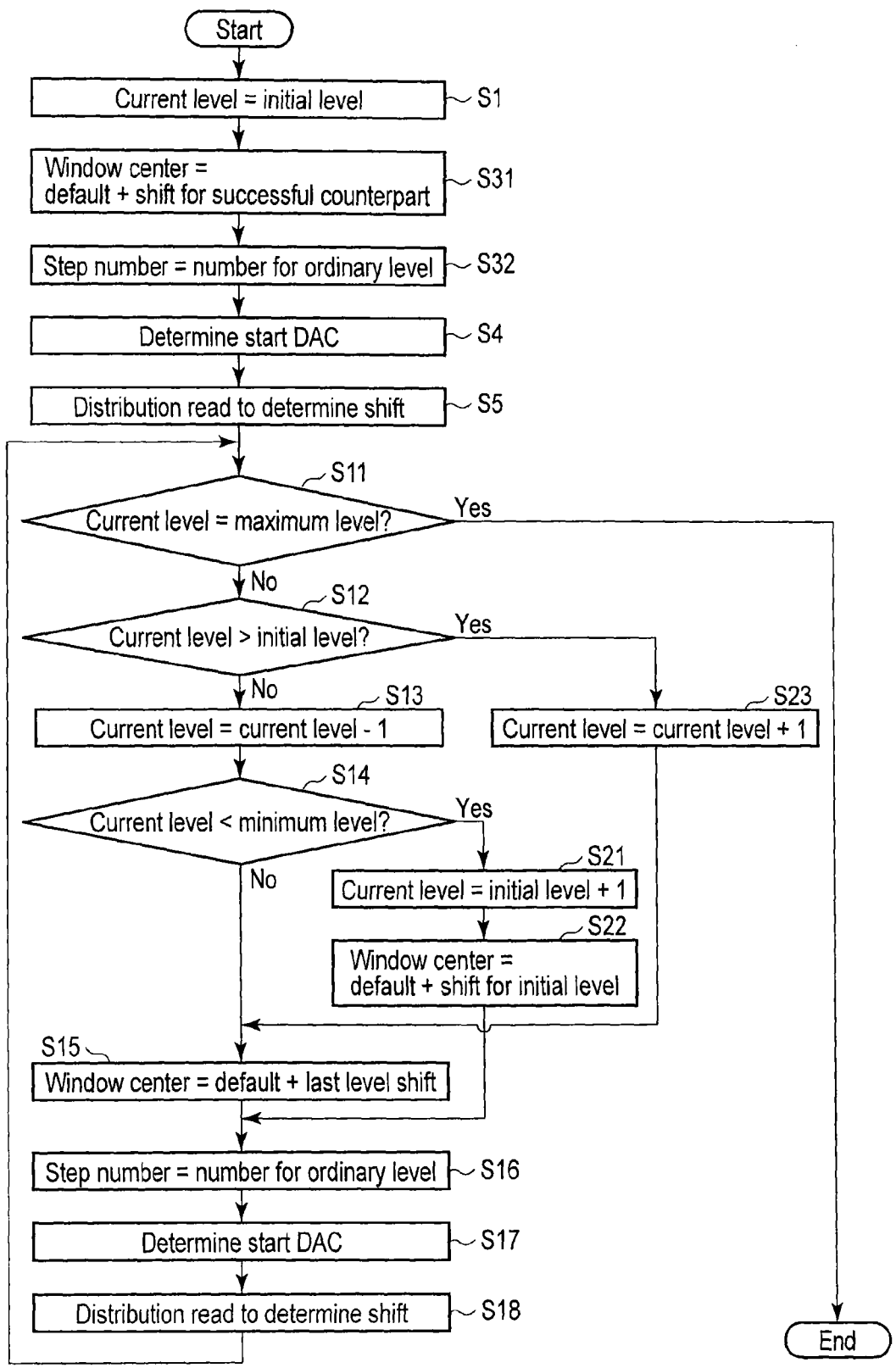
FIG. 9 is a flowchart of read level estimation of a second embodiment.

FIG. 9 illustrates the flow of read level estimation according to the second embodiment. The configuration of the semiconductor memory device of the second embodiment is the same as that of the first embodiment though the memory controller 3 of the second embodiment is configured to execute the following process.

As shown in FIG. 9, the memory controller 3 selects the initial read level (step S1). The initial read level is also assumed E level in the second embodiment. Step S1 continues to step S31.

In step S31, the memory controller 3 sets the center of a search window for the initial read level as follows. The memory 2 erases data per block, and can write data only in erased blocks, or cannot perform overwrite. This results in memory cells in the same block to experience the same number of sets of an erase and a write, and to have data written at substantially the same time. Moreover, in a NAND flash such as the memory 2, memory cells in the same block as those to be read receive read disturbs (or stress) during reads. In sum, the memory cells in the same block receive substantially the same erase disturbs and write disturbs, and have substantially the same elapsed time after the write. This results in an assumption that the memory cells in the same block receive substantially the same total amount of disturbs.

Furthermore, it is known that characteristics of memory cells in the same block such as threshold voltage shift values because of the same disturbs depends on word lines. Specifically, a memory cell coupled to a particular word line such as word line 10 has more similar threshold voltage shift value to that for nearer word lines such as word lines 11 and 12 than that for further word lines such as word line 50, for example.

In the second embodiment, this word line dependence of the memory cell characteristics is used to set search windows for distribution reads. Specifically, it is as follows. During a distribution read for a particular word line, the memory controller 3 adds to the default center a read level shift value for another word line which is included in the same block as the word line of interest and has already experienced the distribution read. Furthermore, when a word line is close to the target word line and has been found that ECC correction with its optimum read level was successful, such a word line is advantageously selected. More specifically, in the example, the center for the initial read level (E level) in step S31 is (its default center)+(the shift value (the adjustment) for the same level (E level) for an ECC-correction-successful word line in the same block). This adjustment is, for example, a shift value for a case where the lower page associated with the word line has data ECC-corrected successfully.

The adjustment can also be based on grouped word lines. Specifically, word lines in a block are divided into groups. Each group is formed to render the same characteristics of memory cells coupled to word lines in the group. For example, the word lines are divided into a set of one ore more word lines at the end of the block, and remaining ones. It is because the memory cells coupled to one or more word lines near the ends have similar properties. The word lines other than those at the ends may further be divided into groups. Thus, word lines which give memory cells the substantially the same characteristics form a group, and the adjustment is the shift value associated with an ECC-correction-successful word line in the group in the same block. The center thus adjusted with the result for other word lines should be closer to the optimum read level than the default.

Step S31 continues to step S32. In step S32, the memory controller 3 sets the number of steps for the distribution read for the current read level (the initial read level) (step S32). The number of steps in step S32 is the same as that for general use (for example, ±7) such as that in the first embodiment. In other words, it is smaller than the number of steps for the initial read level of the first embodiment. This is because the center of the search window is already adjusted. In other words, the adjusted center is expected to be closer to the optimum read level than the default center. For this reason, even a smaller search window with the adjusted center is expected to include the optimum read level.

Steps after step S4 are the same as those in the first embodiment.

As described above, according to the second embodiment, the center of the search window for estimation of each optimum read level is the sum of the default and the estimated shift value for an adjacent read level as in the first embodiment. This can produce the same advantages as those in the first embodiment. Moreover, according to the second embodiment, the center of the search window for the initial read level is adjusted with the shift value for an ECC-correction-successful word line in the same group as the word line associated with the to-be-estimated read level. For this reason, the center of the search window for the initial read level should be closer to the optimum read level than the default. Therefore, even a smaller search window can be highly expected to include the optimum read level within it. Such a small search window results in a reduced time taken to estimate the optimum read level.

Third Embodiment

In the third embodiment, a shift value for a particular read level is used to calculate the center of a search window for another read level.

The NAND flash memories are known to have correlated values of read level shifts because of disturbs. This characteristic may be used to calculate shift values of some read levels. Specifically, a shift value of a representative read level (for example, one for E or F level for an eight level memory case) is first determined through the distribution read. The shift value of the representation read level is then used in a simple function such as a linear function to estimate shift values of other read levels. This technique is used in the third embodiment.

Figure 10:
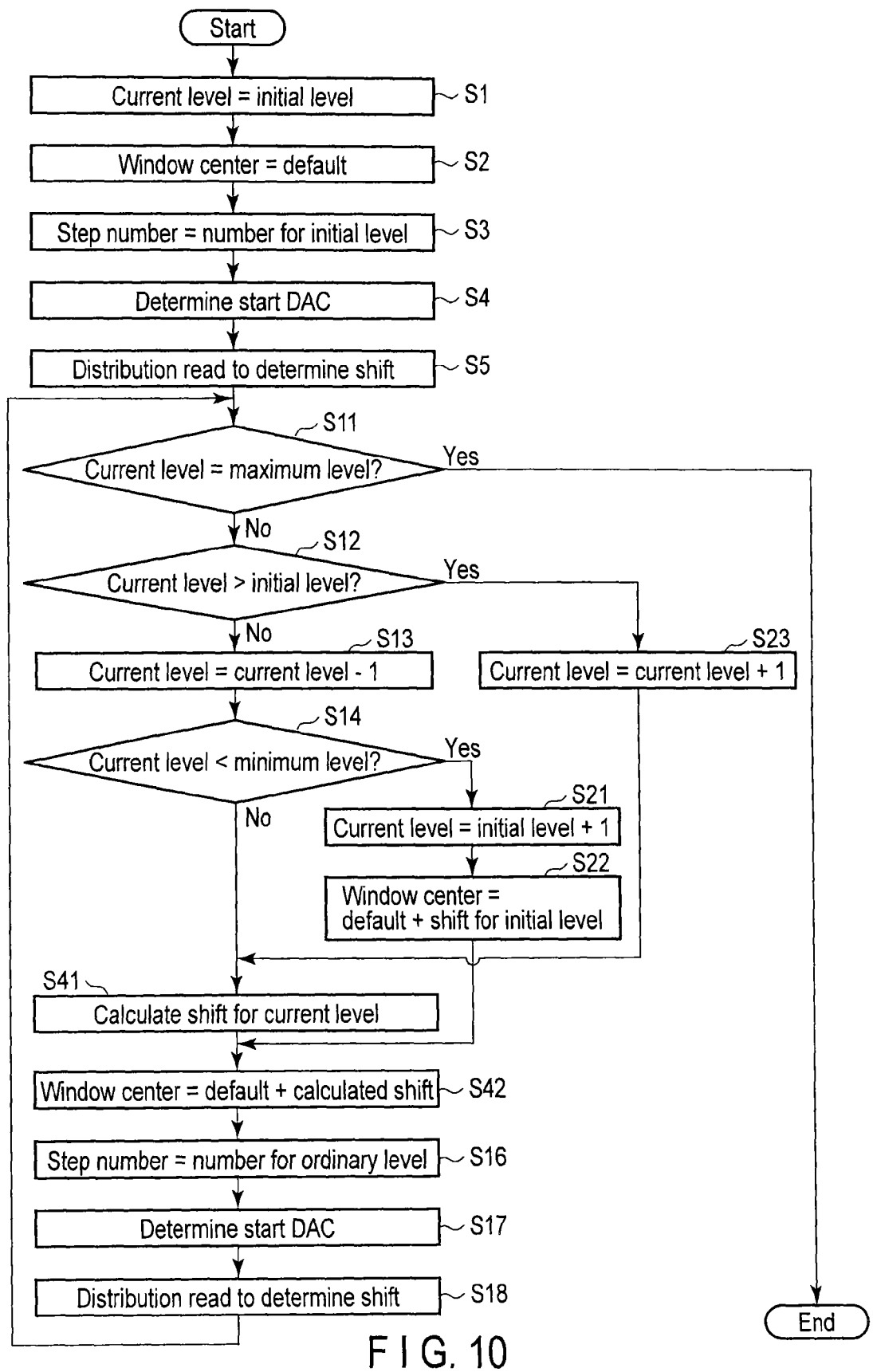
FIG. 10 is a flowchart of read level estimation of a third embodiment.

FIG. 10 illustrates the flow of read level estimation according to the third embodiment. The configuration of the semiconductor memory device of the third embodiment is the same as that in the first embodiment though the memory controller 3 is configured to execute the following process.

First, the memory controller 3 executes steps S1 to S5. In the present embodiment, the initial read voltage can be a read level which represents shifts best among all read levels, for example. Alternatively, the initial read level can be one closest to the average of shift values of all read levels, or one with a large correlation with shifts of all read levels, for example. Alternatively, the initial read level can be one with a small shift such as one for E or F level as in the first and second embodiments.

In the third embodiment, step S15 of the first embodiment is replaced by step S41. In step S41, the memory controller 3 uses the shift value of the initial read level in a formula to estimate a shift value of the current read level. The formula may be common to all non-initial read levels, or exclusive for each read level. For example, memory cells may receive various disturbs such as the read disturb, write disturb, erase disturb and deterioration of data retention. In accordance with these types, threshold voltage shifts also vary, and the magnitudes of shifts of read levels may also vary. In addition, the magnitudes of the shifts depend on read levels. In turn, correlations of shifts of read levels and therefore formulas may also be different. With such difference considered, the formula for each read level is designed.

The memory controller 3 uses the calculated shift value to calculate the center of the search window for the distribution read for the current read level (step S42). Specifically, the memory controller 3 adds the calculated shift value to the default of the current read level to calculate an adjusted center. Step S42 shifts to step S16. Steps after step S16 are the same as those in the first embodiment.

As described above, according to the third embodiment, the center of the search window for estimation of each non-initial read level is the sum of the default and the corresponding shift value calculated from the shift value for the initial read level. For this reason, the adjusted center is close to the optimum read level, and therefore even a small search window is highly expected to include the optimum read level within it as in the first embodiment. Such a small search window results in a reduced time taken to estimate the optimum read level.

The third embodiment may be combined with the second embodiment.

Fourth Embodiment

The fourth embodiment is related to estimation of the minimum and maximum read levels, and is applied to the first, second or third embodiment.

Figure 11:
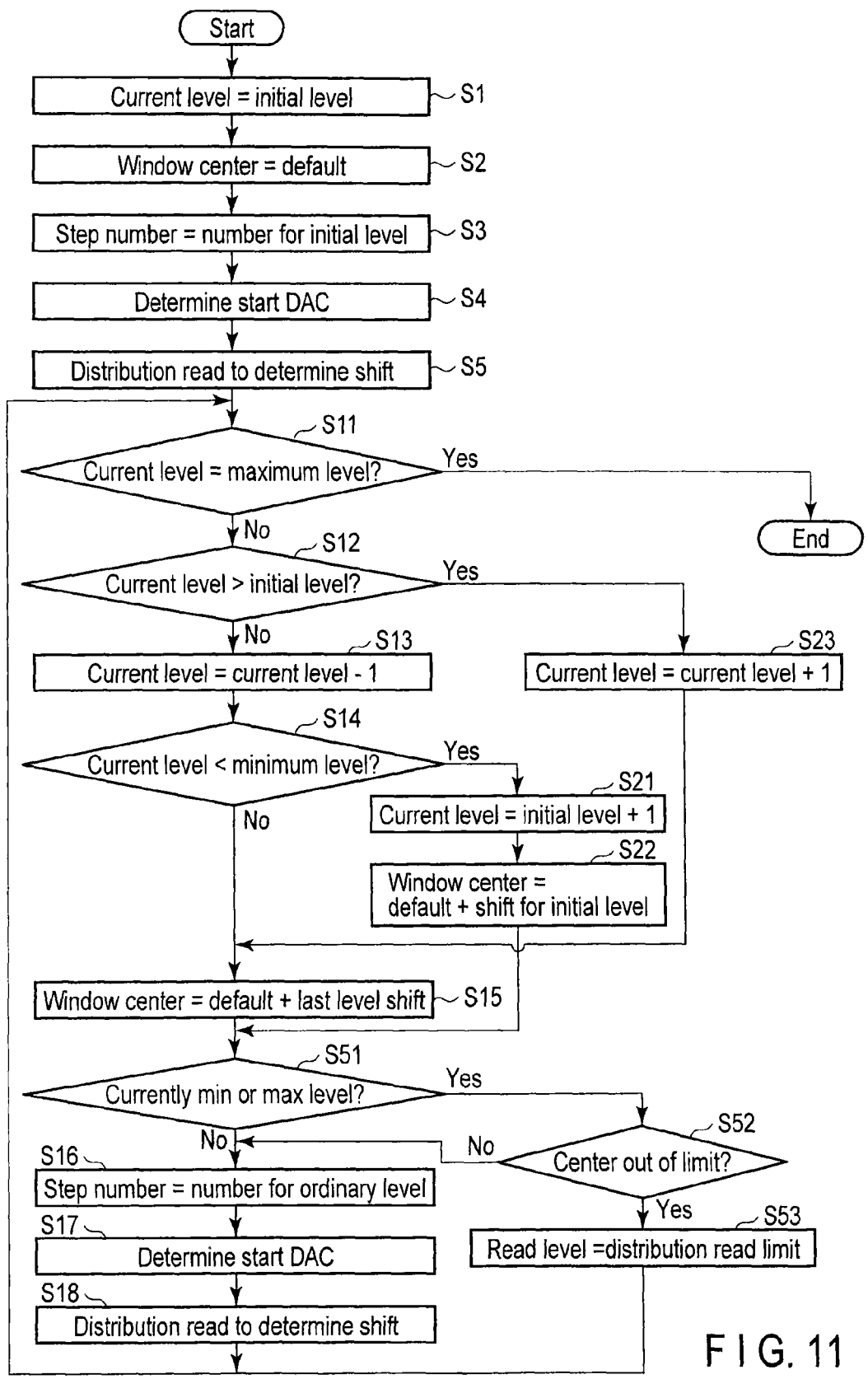
FIG. 11 is a flowchart of read level estimation of a fourth embodiment.

FIG. 11 illustrates the flow of read level estimation according to the fourth embodiment. The configuration of the semiconductor memory device of the fourth embodiment is the same as that in the first embodiment though the memory controller 3 of the fourth embodiment is configured to execute the following process. The fourth embodiment is applied to shift value estimation of the minimum and/or maximum read levels in the flow of the first, second or third embodiment. FIG. 11 illustrates the flow of the fourth embodiment applied to the first embodiment. The fourth embodiment, however, is applicable to the second or third embodiment.

Step S15 continues to step S51. In step S51, the memory controller 3 determines whether the current read level is the minimum or maximum read level (for A and G levels respectively, for example). With determination in step S51 No, the flow shifts to step S16. In contrast, when determination in step S51 is Yes, the flow shifts to step S52.

Figure 12:
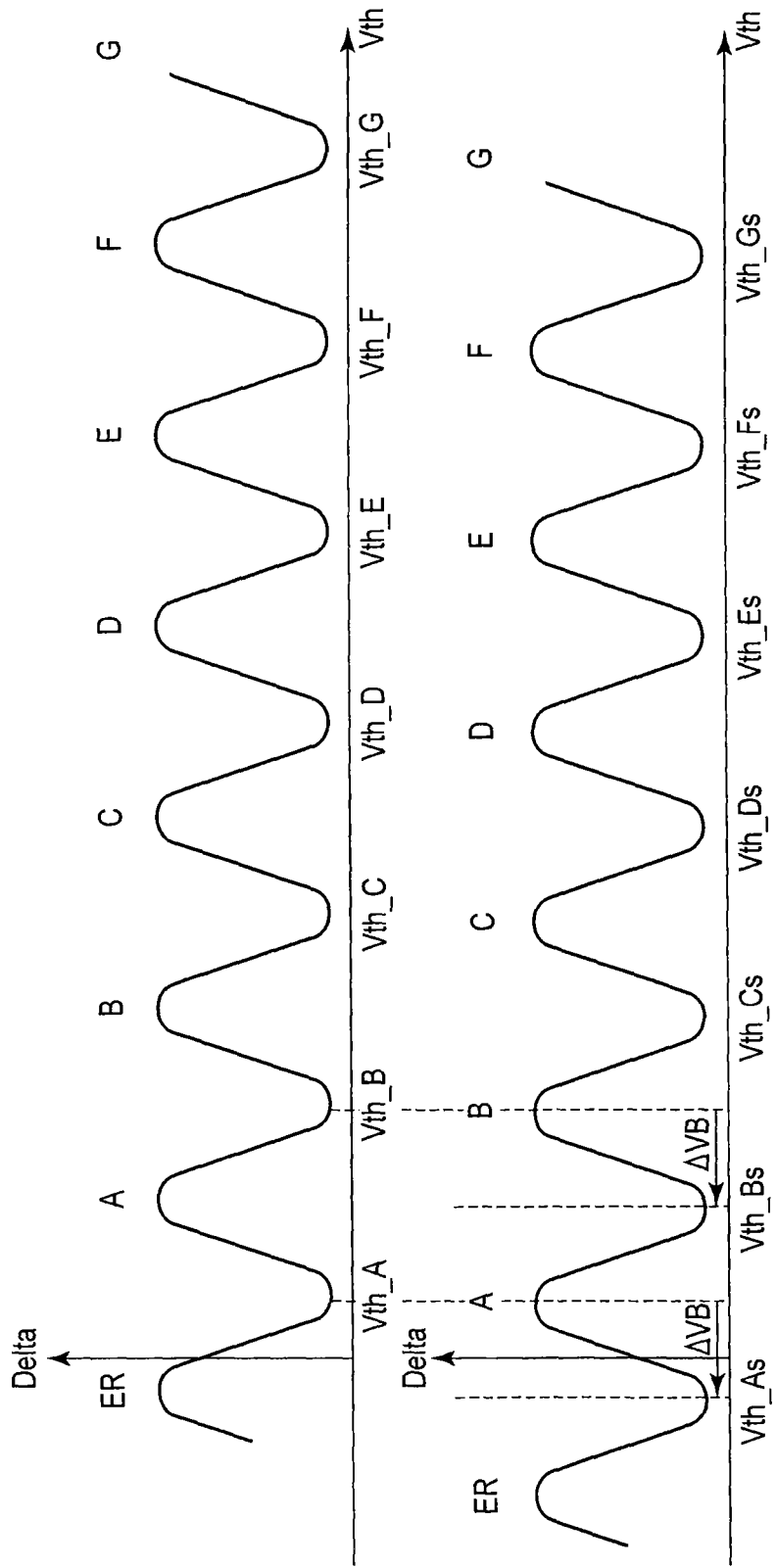
FIG. 12 conceptually illustrates read level estimation of the fourth embodiment.

In step S52, the memory controller 3 determines whether the adjusted center exceeds the limit by which the distribution read can be executed. The distribution read has the lower and upper limits to be executed, and the limits can be expressed with DAC. The restriction on the execution of the distribution read may narrow a search window dynamically set in accordance with the first to third embodiments. Some combination of conditions may even position a whole search window outside the lower or upper limit. For example, the default read level for A level is assumed 15 DAC and the shift value ΔVB of B level −25 DAC, then the center of the search window for A level is calculated as (the default read level for A level)+(the shift value for B level)=15+(−25)=−10 DAC. FIG. 12 conceptually illustrates read level estimation of the fourth embodiment, and the original histogram in the upper part and the histogram after shift in the lower part.

Generally, a distribution read cannot be executed to with a negative DAC. When the estimated center is negative, the distribution read will be executed only to positive DACs. Specifically, assume that a search window for A level is ±28 DAC from the center and a step size is 4 DAC, then the DAC three step higher than the center is the minimum DAC. More specifically, the start point of the distribution read is −10+4× 3=2 DAC. The upper limit of the search window is (the center)+(the number of steps×the step size)=−10+28=18 DAC.

Based on such a start point and an upper limit, the search window is as narrow as between 2 DAC and 18 DAC. Furthermore, using the estimation with the method disclosed in the specification of the U.S. patent application Ser. No. 13/544,147, the smoothing further narrows the both ends of the search window by, for example, 6 DAC each. In other words, an effective search window is between 8 DACs and 12 DAC, and effective search points include only two points, or 8 and 12 DAC. Estimation with such a few points leads to low accuracy results. In contrast, the optimum read level is expected to be near the center (=−10 DAC), and therefore the optimum read level for A level is highly unlikely to lie between 0 DAC and the upper limit of 18 DAC. Then, it is determined in step S52 whether the adjusted center exceeds the range over which the distribution read can be executed.

Referring back to FIG. 11, with determination in step S52 No, the flow shifts to step S16. In contrast, when the determination in step S52 is Yes, the flow shifts to step S53. In step S53, the memory controller 3 sets the optimum read level for the current read level (for A or G level, for example) as a limit by which the distribution read can be executed. One for A level is the lower limit (0 DAC), and one for G level is the upper limit, or the maximum DAC with which the distribution read can be executed, such as 767 DAC. Step S52 continues to step S11.

As described above, the fourth embodiment can produce the advantages obtained by the first, second or third embodiment to which the fourth embodiment is applied. Furthermore, in the fourth embodiment, when the center of each search window of the minimum and/or maximum read levels exceeds the limit for an executable distribution read, the center is set as the limit by which the distribution read can be executed. This avoids execution of a distribution read with DACs which hardly result in estimation of the optimum read level. This results in an increased efficiency of the optimum read level estimation.

Fifth Embodiment

The fifth embodiment is also related to estimation of the minimum and maximum read levels and applied to the first, second or third embodiment.

Figure 13:
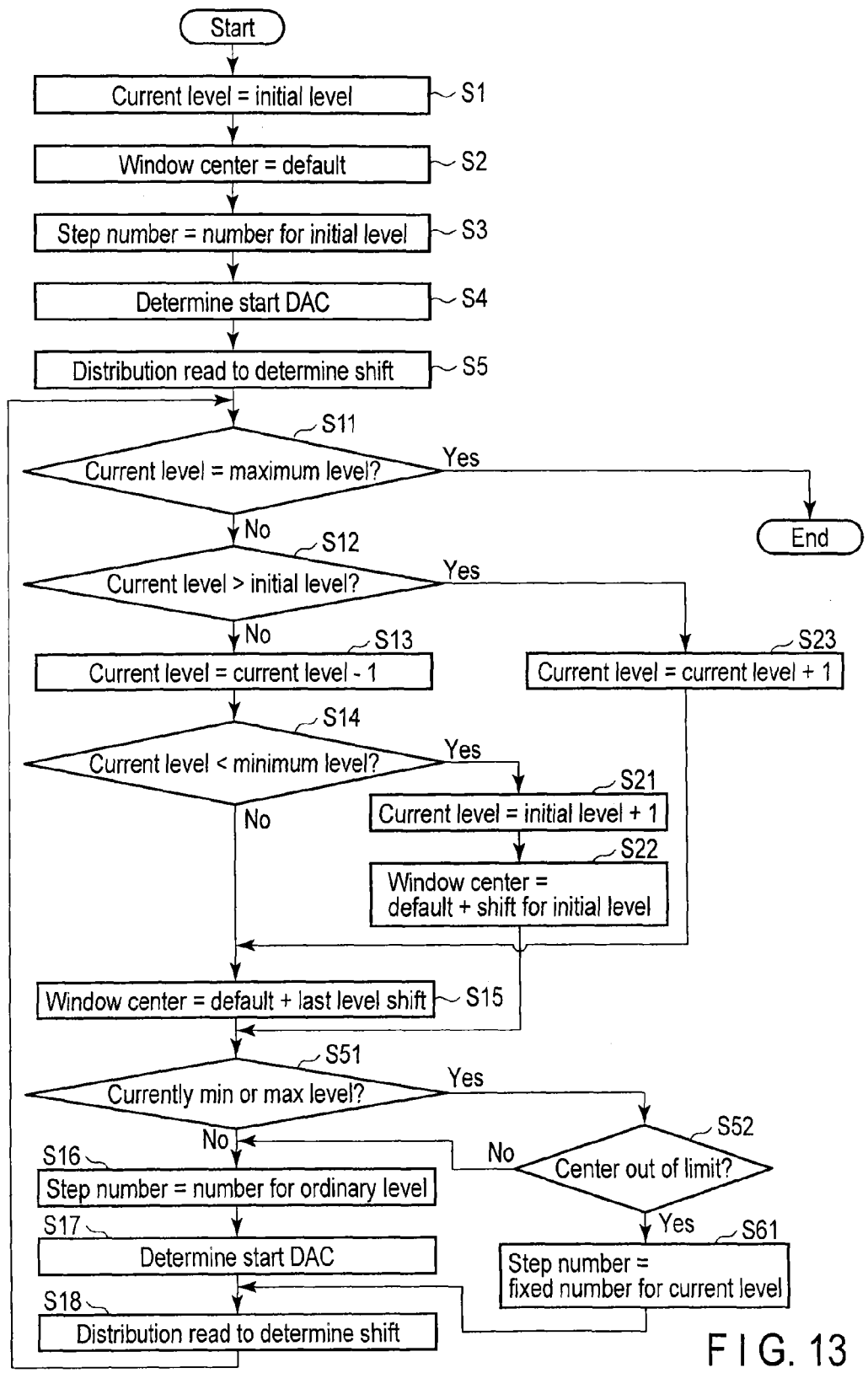
FIG. 13 is a flowchart of read level estimation of a fifth embodiment.

FIG. 13 illustrates the flow of read level estimation according to the fifth embodiment. The configuration of the semiconductor memory device of the fifth embodiment is the same as that in the first embodiment though the memory controller 3 of the fifth embodiment is configured to execute the following process. The fifth embodiment is applied to shift value estimation of the minimum and/or maximum read levels in the flow of the first, second or third embodiment. FIG. 13 illustrates the flow with the fifth embodiment applied to the first embodiment. The fifth embodiment, however, is also applicable to the second or third embodiment.

Figure 14:
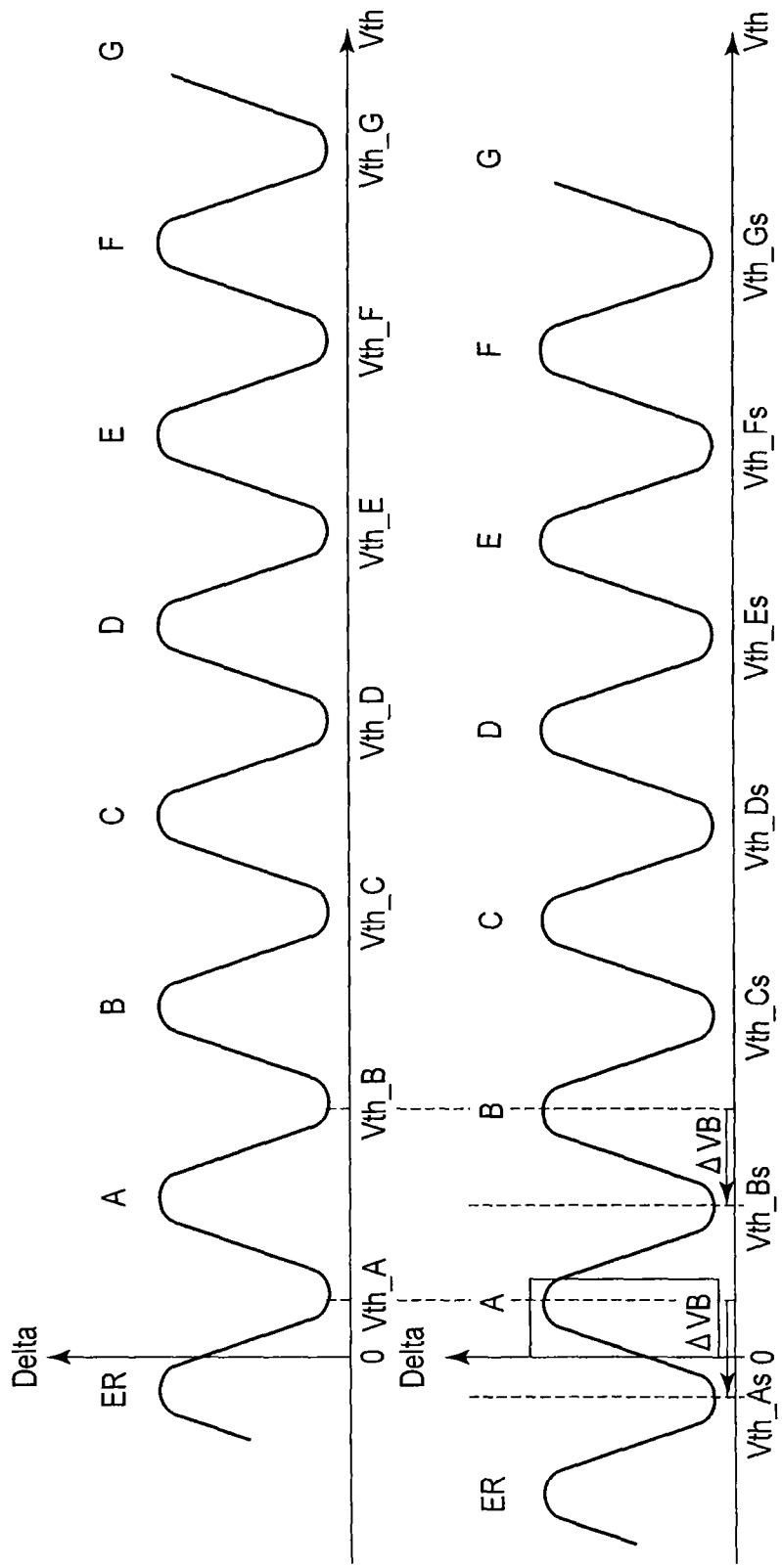
FIG. 14 conceptually illustrates read level estimation of the fifth embodiment.

In the fifth embodiment, step S53 of the fourth embodiment is replaced by step S61. Based on an example in the fourth embodiment, the center of the search window for A level is calculated as −10 DAC as shown in FIG. 12. Furthermore, as described for the fourth embodiment, effective search points include only two points, 8 and 12 DAC. In contrast, the optimum read level is expected to be near the center (=−10 DAC). Therefore, a read with any of the effective search points of 8 and 12 DAC should also result in errors fewer than would be with the default of 15 DAC. Furthermore, shifts of read levels may not be correlated. Specifically, when shifts of read levels in the negative direction due to data retention deterioration and shifts of only A and B levels in the positive direction as seen in the read disturb are mixed, B level may greatly shift in the negative direction and only A level may shift in the positive direction or shift in the negative direction less than B level. In order to accommodate such weak correlation case also, even for a small search window for A level, the distribution read is executed over the dedicated predetermined number of steps (for example, ten steps). FIG. 14 conceptually illustrates setting of a search window in the fifth embodiment, and illustrates the original histogram in the upper part and a shifted histogram in the lower part. When the search range of either end (A level, in this case) lies outside the distribution read executable range, the distribution read is executed over the search range shown by the square in the lower part of FIG. 14.

In accordance with the above example, the memory controller 3 uses as the search window a range of 7 steps from 0 DAC, i.e., (7−1)×4=24 DAC, in step S61. The determination of the search window is determined in accordance with the characteristics of the memory cells. Specifically, a search window is determined, for example, in accordance with empirical rules for characteristics such as disturbs and/or data retention deterioration of minimum and/or maximum read levels, experiments with samples, and simulation, etc.

Step S61 continues to step S18. In step S18, the memory controller 3 executes the distribution read with the range of the search window determined in step S61 from 0 DAC to estimate the optimum read level. Following the current context, with influences by noises on the distribution read ignored and 6 DAC unavailable as a result of the smoothing taken into consideration, the memory controller 3 determines that +6 DAC is the optimum shift value for A level.

As described above, the fifth embodiment can produce the advantages obtained by the first, second or third embodiment to which the fifth embodiment is applied. Furthermore, in the fifth embodiment, when the center of the search window of the minimum and/or maximum read levels exceeds the limit for which the distribution read can be executed, a dedicated predetermined search window is used. This results in more accurate estimation of the read levels.

Sixth Embodiment

The sixth embodiment is related to the number of steps for general levels, and is applied to first, second, third, fourth or fifth embodiment.

In the first to fifth embodiments, the center of a search window for a read level is adjusted with hints such as a shift value of another read level and a shift value for a related word line. This results in steps fewer than a case with default centers and estimation of read level possible with the same or even an improved accuracy. These characteristics are used to reduce the number of steps for general level (the value used in step S16, for example). Specifically, the number of steps for general level of the first embodiment is selected to be 80 to 120% of the difference between adjacent read levels as described above. In contrast, in the sixth embodiment, the number of steps is determined to allow a search window to include the optimum read level in accordance with the experience, etc. For example, the number of steps is selected to be about 40% of the difference between adjacent read levels. Specifically, for example, if the difference between read levels is 60 DAC, then the number of steps is twelve and the effective search window is 24 DAC, i.e., (12 step×4 DAC)−(6 DAC at each of both ends unavailable because of the smoothing×2). Even with such a search window, the estimated read level can be found as accurately as with the original search window.

As described above, the sixth embodiment can produce the advantages obtained by the first, second, third, fourth or fifth embodiment to which the sixth embodiment is applied. Furthermore, in the sixth embodiment, the search window for general level is narrower than that in the first to fifth embodiments. This results in improved efficiency of the read level estimation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    memory cells each given one of threshold voltages to store data; and
    a controller configured to:
        use read voltages to determine threshold voltages of the memory cells,
        use voltages over a window to read data from the memory cells to determine distribution of the threshold voltages of the memory cells to estimate a read voltage, execute the estimation of a read voltage for each of the read voltages, use an estimated value of a first read voltage of the read voltages to determine a window for estimation of a second read voltage of the read voltages, wherein the memory cells include first memory cells coupled to a first word line and second memory cells coupled to a second word line, the first and second word lines belong to a group, the estimated value of the first read voltage is based on distribution of threshold voltages of the first memory cells, and a window for estimation of the first read voltage is based on a value estimated in accordance with distribution of threshold voltages of the second memory cells for a read voltage corresponding to the first read voltage.

2. The device of claim 1, wherein the second read voltage is adjacent to the first read voltage.

3. The device of claim 2, wherein the controller is configured to use an estimated value of the second read voltage to determine a window for estimation of a third read voltage of the read voltages.

4. The device of claim 3, wherein the controller is configured to determine, for each of the read levels, a window for estimation of that read level based on an estimated value of another read level adjacent to that read level.

5. The device of claim 1, wherein:
the read voltages correspond to the threshold voltages one by one and have respective defaults; and
the controller is configured to:
calculate a difference between a default of the first read voltage and the estimated value of the first read voltage, and
determine a window for estimation of the second read voltage in accordance with the difference.

6. The device of claim 5, wherein the controller is configured to:
calculate a center from a sum of a default of the second read voltage and the difference, and
use a range with a first offset at both sides of the center as the window for estimation of the second read voltage.

7. The device of claim 6, wherein the controller is configured to use a range with a second offset at both sides of the default of the first read voltage as the window for estimation of the first read voltage.

8. The device of claim 1, wherein the estimated value of the first read voltage is optimum compared with a default of the first read voltage, and an estimated value of the second read voltage is optimum compared with a default of the second read voltage.

9. The device of claim 1, wherein:
the estimated value of the first read voltage minimizes errors of data read from first memory cells of the memory cells with the first read voltage, and
an estimated value of the second read voltage minimizes errors of data read from second memory cells of the memory cells with the second read voltage.

10. The device of claim 1, wherein a window for estimation of the first read voltage is narrower than the window for estimation of the second read voltage.

11. The device of claim 1, wherein the first read voltage shifts least among the read voltages except for minimum and maximum read voltages of the read voltage.

12. The device of claim 1, wherein:
the estimated value of the first read voltage corresponds to a first threshold voltage of the threshold voltages; and
the window for estimation of the first read voltage is based on an estimated value of a third read voltage for the first threshold voltage of the second memory cells.

13. The device of claim 1, wherein the controller is configured to:
use the estimated value of the first read voltage to calculate an estimated value of the second read voltage;
calculate a difference between a default of the second read voltage and an estimated value of the second read voltage; and
use the sum of the default of the second read voltage and the difference as a center of the window for estimation of the second read voltage.

14. The device of claim 1, wherein when the window of estimation of the second read voltage spreads beyond a range within which estimation of a read voltage is executable, the controller uses a lower or upper limit of the range as a lower or upper limit of the window for estimation of the second read voltage.

15. The device of claim 1, wherein:
when the window of estimation of the second read voltage spreads beyond a range within which estimation of a read voltage is executable, the controller uses a fixed window as the window for estimation of the second read voltage; and
the first window has the same lower or upper limit as a lower or upper limit of the range within which the distribution read is executable.

16. The device of claim 1, wherein a window for estimation of the first read voltage is smaller than a default window for estimation of the first read voltage.

17. A semiconductor memory device comprising:
memory cells each given one of threshold voltages to store data; and
a controller configured to:
use read voltages to determine threshold voltages of the memory cells,
use voltages over a window to read data from the memory cells to determine distribution of the threshold voltages of the memory cells to estimate a read voltage,
execute the estimation of a read voltage for each of the read voltages,
use an estimated value of a first read voltage of the read voltages to determine a window for estimation of a second read voltage of the read voltages, wherein
when the window of estimation of the second read voltage spreads beyond a range within which estimation of a read voltage is executable, the controller uses a lower or upper limit of the range as a lower or upper limit of the window for estimation of the second read voltage.

18. A semiconductor memory device comprising:
memory cells each given one of threshold voltages to store data; and
a controller configured to:
use read voltages to determine threshold voltages of the memory cells,
use voltages over a window to read data from the memory cells to determine distribution of the threshold voltages of the memory cells to estimate a read voltage,
execute the estimation of a read voltage for each of the read voltages,
use an estimated value of a first read voltage of the read voltages to determine a window for estimation of a second read voltage of the read voltages, wherein when the window of estimation of the second read voltage spreads beyond a range within which estimation of a read voltage is executable, the controller uses a fixed window as the window for estimation of the second read voltage, and the first window has the same lower or upper limit as a lower or upper limit of the range within which the distribution read is executable.

* * * * *